United States Patent
Schwartz et al.

(10) Patent No.: US 9,729,047 B2
(45) Date of Patent: Aug. 8, 2017

(54) PRINTABLE PULSED VOLTAGE MULTIPLIER WITH ADJUSTABLE PULSE WIDTH AND AMPLITUDE

(71) Applicant: Palo Alto Research Center Incorporated, Palo Alto, CA (US)

(72) Inventors: David Eric Schwartz, San Carlos, CA (US); Tse Nga Ng, Sunnyvale, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 51 days.

(21) Appl. No.: 14/708,913

(22) Filed: May 11, 2015

(65) Prior Publication Data

US 2016/0336849 A1    Nov. 17, 2016

(51) Int. Cl.
*H02M 3/07* (2006.01)
*H01L 21/02* (2006.01)

(52) U.S. Cl.
CPC ........ *H02M 3/07* (2013.01); *H01L 21/02288* (2013.01)

(58) Field of Classification Search
CPC .......... H02M 3/07; H02M 3/073; H02M 7/10; H02M 7/103; H02M 7/106
USPC ....................................................... 363/60, 61
See application file for complete search history.

(56) References Cited

U.S. PATENT DOCUMENTS

| | | | | |
|---|---|---|---|---|
| 4,199,806 A | * | 4/1980 | Patterson, III | H02M 3/07 363/60 |
| 5,581,455 A | * | 12/1996 | Rossi | H02M 3/07 327/536 |
| 7,480,364 B2 | * | 1/2009 | Sundaram | H05G 1/10 361/756 |
| 2007/0236842 A1 | * | 10/2007 | Choi | H01L 27/0262 361/56 |
| 2013/0242627 A1 | | 9/2013 | Bedell et al. | |

* cited by examiner

*Primary Examiner* — Yemane Mehari
(74) *Attorney, Agent, or Firm* — Marger Johnson (57) ABSTRACT

A voltage multiplier includes a supply voltage, at least two multiplier stages electrically connected together, each stage having a trigger voltage terminal, an input terminal, an output terminal, and a capacitor, and each stage connected to the supply voltage, an input stage electrically connected to a first of the at least two multiplier stages, and an output stage electrically connected to a final of the at least two multiplier stages.

14 Claims, 7 Drawing Sheets

PRINTABLE PULSED VOLTAGE MULTIPLIER WITH ADJUSTABLE PULSE WIDTH AND AMPLITUDE

TECHNICAL FIELD

This disclosure relates to voltage multipliers, more particularly to voltage multipliers fabricated with printing techniques.

BACKGROUND

The ability to print electronic circuits provides several advantages over traditional manufacturing processes. Typically, these processes add materials to form devices such as thin film transistors (TFT). The processes are referred to as additive printing process. The advantages include lower cost, faster production, and reduced times between design and manufacturing. However, these devices tend to have limited currents and the ratio between the ON and OFF currents can be relatively low.

In some circuits, a need may arise for the voltage at a circuit node to have a voltage higher than a supply voltage. One possible solution involves a voltage pump or voltage multiplier that delivers an increased voltage over an extended period of time. For some circuits, delivering high voltage for a limited duration may be sufficient and result in increased efficiency and reduced device performance requirements. A pulsed voltage multiplier can meet these requirements.

In the printed electronics area, traditional voltage pumps are challenging to implement Because of low thin film transistor (TFT) ON/OFF ratios and currents, limited diode current, and capacitor leakage. Other circuit designs are needed to circumvent these issues. Also, with printed electronics, reducing the number of types of components has advantages. This reduces the number of different ink formulations, number of print heads, number of print passes, etc. In turn, this reduces the overall production costs and complexity and increases the speed of production. In general, different voltage multiplier architectures are needed.

SUMMARY

One embodiment is a voltage multiplier including a supply voltage, at least two multiplier stages electrically connected together, each stage having a trigger voltage terminal, an input terminal, an output terminal, and a capacitor, and each stage connected to the supply voltage, an input stage electrically connected to a first of the at least two multiplier stages, and an output stage electrically connected to a final of the at least two multiplier stages.

Another embodiment is method of manufacturing a voltage multiplier, including loading a print head with solution, sending circuit schematics to drive electronics in communication with the print head, printing an input stage for a voltage multiplier on a substrate, printing a pre-determined number of multiplier stages on the substrate such that a first of the multiplier stages connect to the input stage and each multiplier stage connects to other multiplier stages, and printing an output stage such that a final multiplier stage connects to the output stage.

Another embodiment is a method of operating a voltage multiplier, including providing a supply voltage to a diode in a first multiplier stage, the diode electrically connected to the first terminal of a capacitor, charging the capacitor to the supply voltage, delivering a trigger signal to a transistor electrically connected to a second terminal of a capacitor, the trigger signal causing the transistor to turn off, and delivering a voltage output from the first terminal of the capacitor that is higher than the supply voltage.

DETAILED DESCRIPTION OF THE EMBODIMENTS

In some situations and applications, a circuit node may need to reach a voltage higher than the supply voltage. Particularly, some applications require a higher than supply voltage for a limited duration, rather than for an extended or indefinite time. Voltage pumps can generally meet the requirement of increased voltage for an extended time, but using a pulsed voltage multiplier has advantages of increased efficiency and reduced device performance requirements. The embodiments of pulsed voltage multipliers here have an additional advantage of methods to control the output pulse width and amplitude.

Figure 1:
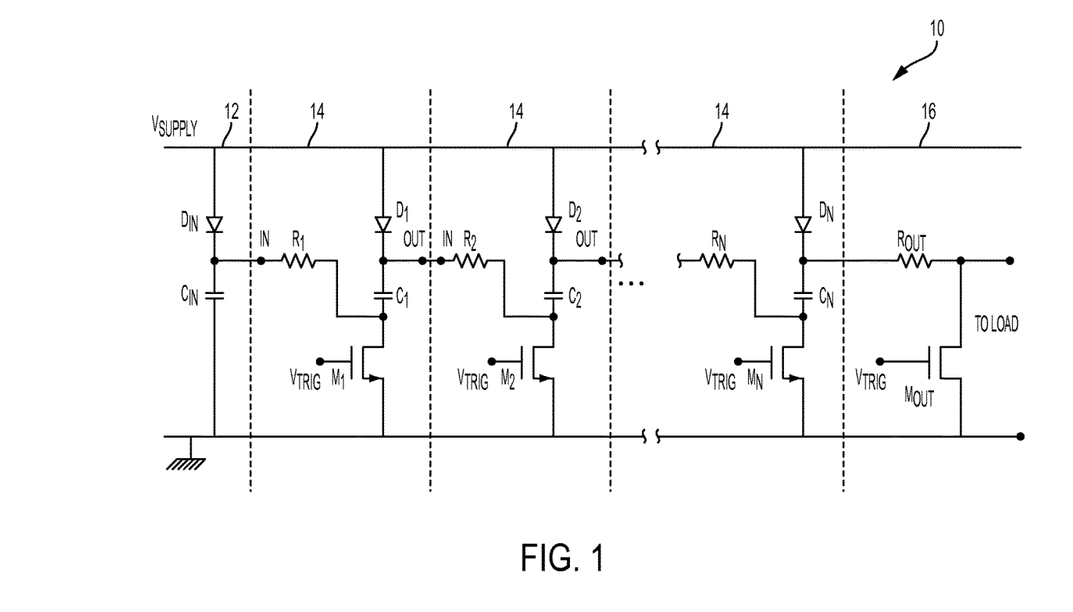
FIG. 1 shows an embodiment of a voltage multiplier circuit.

FIG. 1 shows an embodiment of a pulsed voltage multiplier 10. The voltage multiplier in this embodiment consists of an input stage 12, at least one multiplier stage 14 and an output stage 16. The multiplier stage 14 may be repeated as many times as needed to reach a particular voltage. Each multiplier stage can have the same architecture and component values, or have different architecture or component values.

The ability to print semiconductor circuits has several advantages including reduction of time between design and manufacture, reduced cost of manufacture, and flexibility in making changes to the design.

In operation, with trigger voltage $V_{TRIG}$ high, trigger transistor $M_1$ is on, and capacitor C1 pre-charges to the supply voltage, $V_{SUPP}$ through diode D1. Then trigger voltage $V_{TRIG}$ is switched to a low value, turning transistor $M_1$ off. When that transistor turns off, the output voltage at the output terminal OUT becomes an output voltage higher than the supply voltage. The output terminal for each stage becomes the input terminal IN at the next stage.

Figure 2:
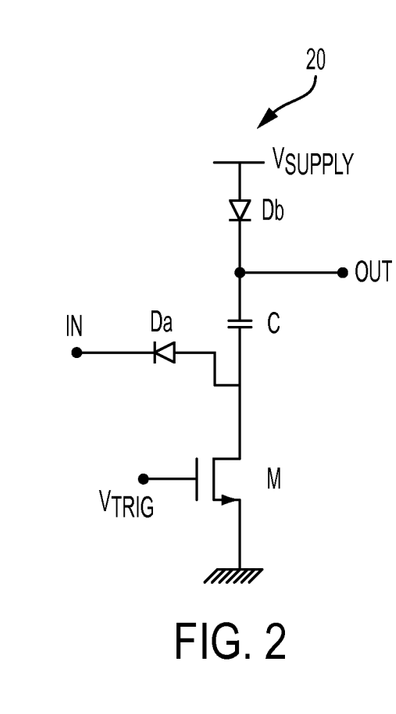
FIGS. 2-5 show alternative embodiments of multiplier stages.

FIGS. 2-5 show different embodiments of the multiplier stage. One should note that these merely provide examples and should not be interpreted to limit the scope of the claims to any particular architecture. FIG. 2 shows an embodiment of a multiplier stage 20 having first and second diodes and a transistor. The input terminal IN to the stage may be electrically connected to the output terminal of another stage or an input stage. The embodiment of FIG. 2 has a diode $D_A$ that connects to the input terminal in a reverse bias fashion. The diode $D_A$ connects to a second terminal of the capacitor C. Diode $D_B$ connects between the supply voltage $V_{SUPP}$ and the first terminal of the capacitor C, and the output terminal of the multiplier stage. This architecture may be referred to as diode-diode-transistor.

The second terminal of the capacitor C also connects to the trigger transistor M by the drain of M, and the gate of M is connected to the trigger voltage. The trigger voltage may take many forms, but for purposes of discussion here will take the form of a signal input similar to a clock signal of pulses having rising and falling edges. The transistor M consists of an n-type transistor as shown, so the falling edge of the trigger signal causes the transistor to turn off. One should note that this could be implemented in opposite polarity logic and no limitation to a particular polarity is intended nor should any be implied.

Figure 3:
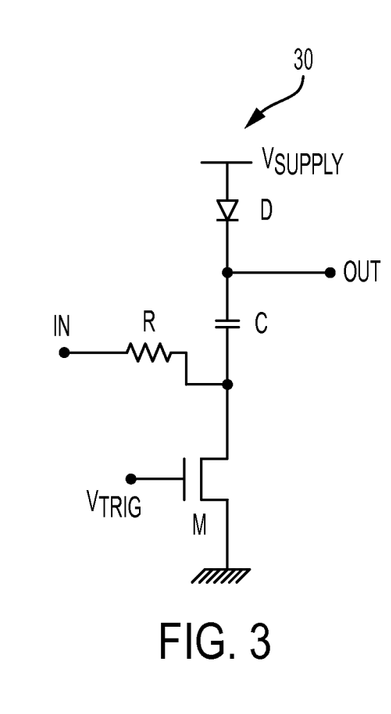

FIG. 3 shows an alternative embodiment of a multiplier stage 30. The diode $D_A$ has been replaced with a resistor R. The diodes in these embodiments connected to the input terminal for the stage will typically be reverse-biased, if the transient currents are relatively small. This makes possible the replacement of the diode from FIG. 2 with the resistor, and the diodes connected to the supply voltage with transistors in further embodiments. This embodiment may be referred to as diode-resistor-transistor.

Figure 4:
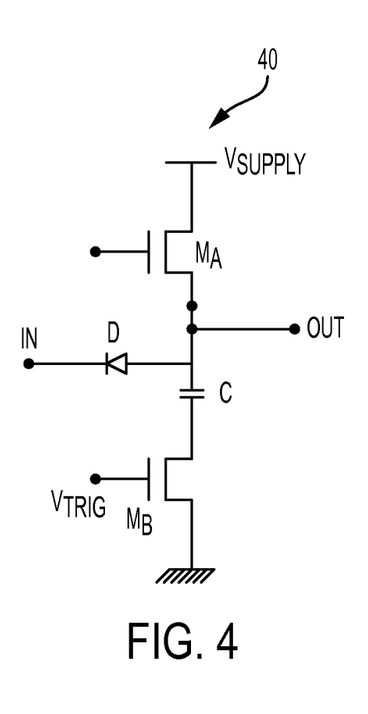

FIG. 4 shows another alternative embodiment of a multiplier stage 40. In this embodiment, a first transistor $M_A$ connects the stage to the supply voltage and a second transistor $M_B$ acts as the trigger transistor. A diode D connects the capacitor C to the input terminal of the stage. The output terminal of the stage connects at the source of the supply transistor $M_A$. The gate of the transistor $M_A$ is shown as unconnected, because the gate may connect to the OUT node, or it may be connected to a separate bias voltage, among other options. As mentioned above, the relatively small transient currents allow the replacement of the transistors with the diodes. This may be referred to as transistor-diode-transistor.

Figures 5, 6:
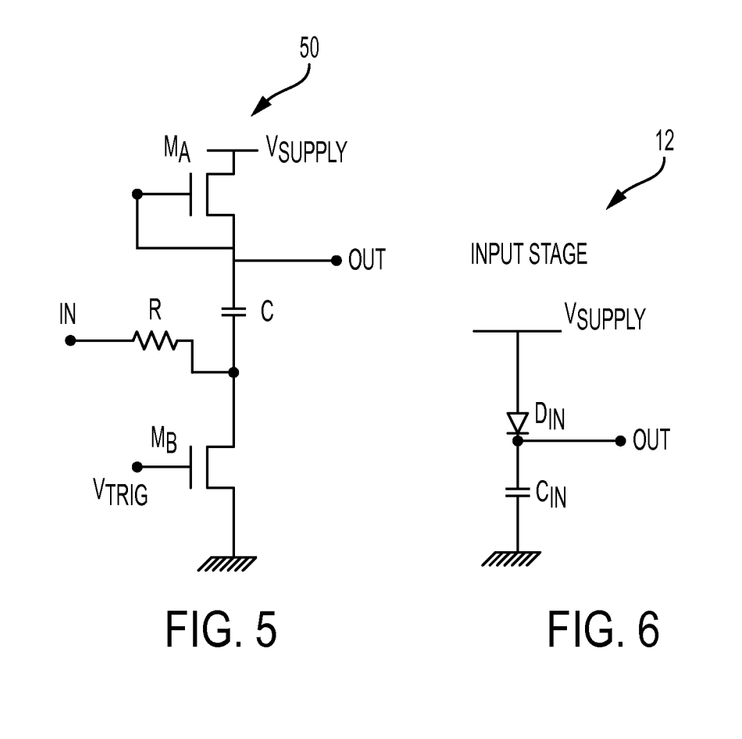
FIG. 6 shows an embodiment of an input stage.

FIG. 5 shows an alternative embodiment of a multiplier stage 50. This architecture is similar to the diode-resistor-transistor architecture of FIG. 3, but the supply diode has been replaced with a supply transistor $M_A$. This may be referred to as transistor-resistor-transistor.

Figure 7:
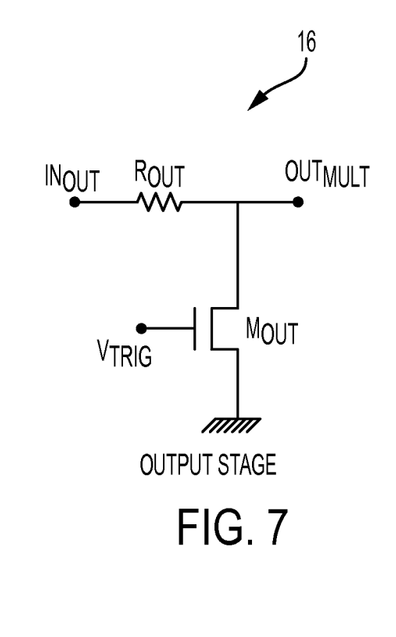
FIG. 7 shows an embodiment of an output stage.

Any of these stages can be used as multiplier stages such as 14 in FIG. 1. In an embodiment of a complete embodiment, the multiplier stages may have an input stage 12 and an output stage 16. FIG. 6 shows an embodiment of an input stage 12. The input stage in this embodiment consists of a diode $D_{IN}$ and an input capacitor $C_{IN}$. The output OUT of the input stage connects to the input terminal in the first of the multiplier stages. FIG. 7 shows an embodiment of an output stage 16, which may be connected to the final of the multiplier stages. In this embodiment, the input of the output stage $IN_{OUT}$ is the output of the final of the repeated multiplier stages. The output resistor $R_{OUT}$ connects the input to the multiplier output. The output voltage of the output stage is referred to as the multiplier output rather than the stage output, to differentiate it from the outputs of the individual stages. The transistor $M_{OUT}$ provides the output control. This transistor pulls the output of the multiplier close to ground when a high voltage pulse is not desired and the trigger signal is high.

Figure 8:
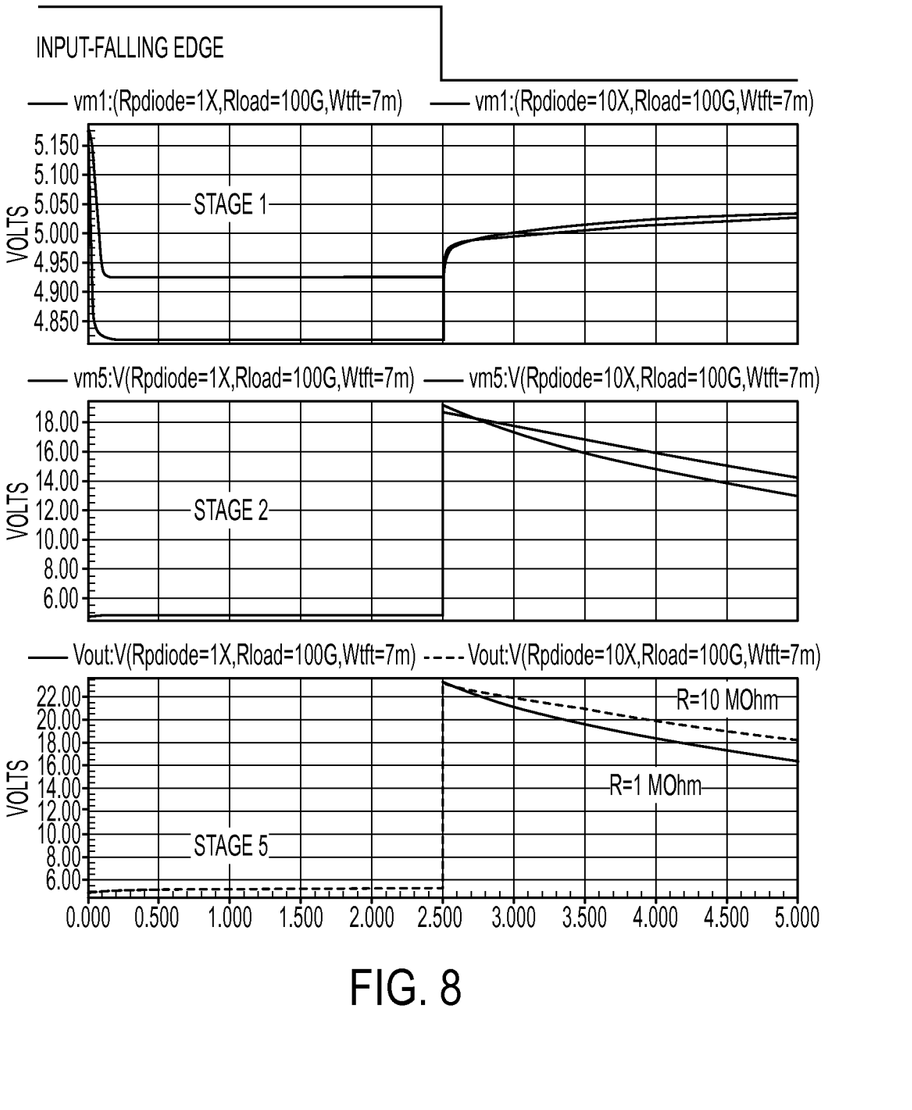
FIG. 8 shows a timing diagram for an embodiment of a voltage multiplier.

In the absence of such a stage, the quiescent output voltage is close to the supply voltage and may remain so. If there is a purely capacitive load, the discharge occurs only through leakage resistance, and the output voltage may stay high indefinitely. FIG. 8 shows the voltage output of an embodiment of a multiplier on the falling edge of the input. Without a subsequent rising edge to turn on the pull-down transistor, the voltage stays essentially high. The two output traces represent a first resistance and a second resistance, where the second resistance is 10× the first. The architecture used in the simulation is the diode-resistor-transistor combination.

Figure 9:
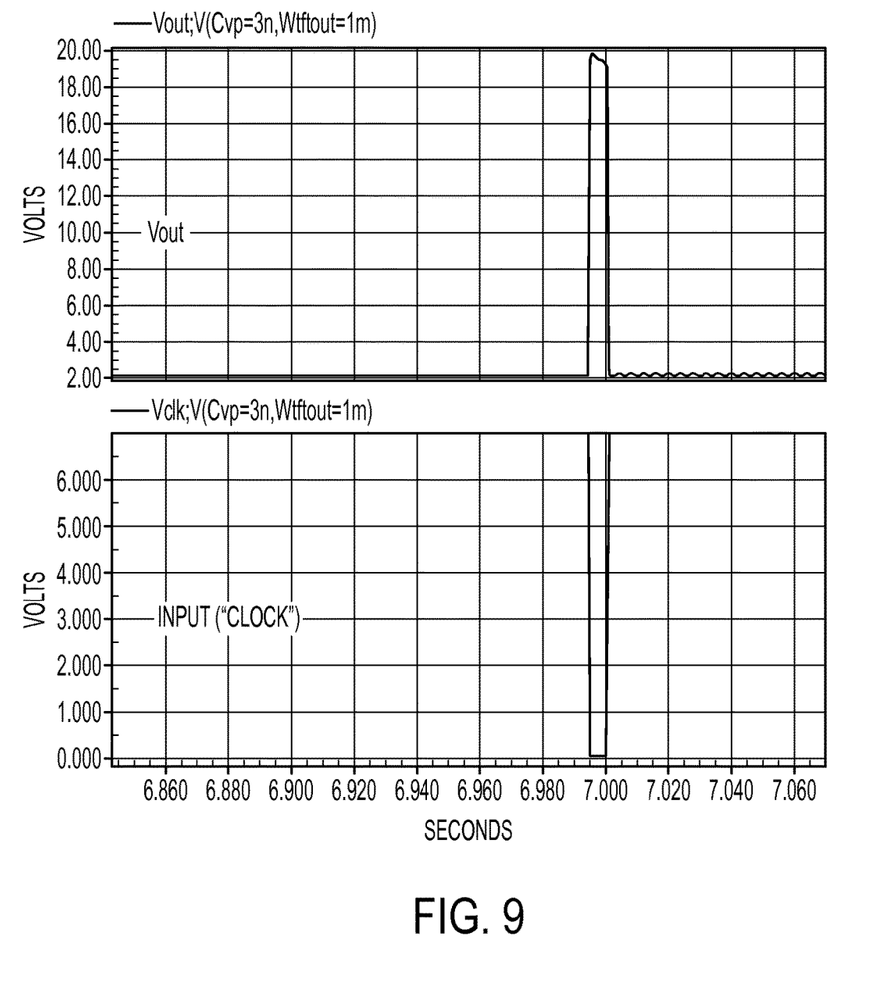
FIG. 9 shows a timing diagram for input and output signals.

FIG. 9 shows the effect on the output in the upper trace when the input clock signal of $V_{TRIG}$ provides a rising edge to the pull-down transistor in the output stage. As can be seen here, once the input signal goes high again, the voltage is discharged and the quiescent voltage settles near ground. Another characteristic of this multiplier is that the output pulse width follows the input pulse width fairly precisely.

Figure 10:
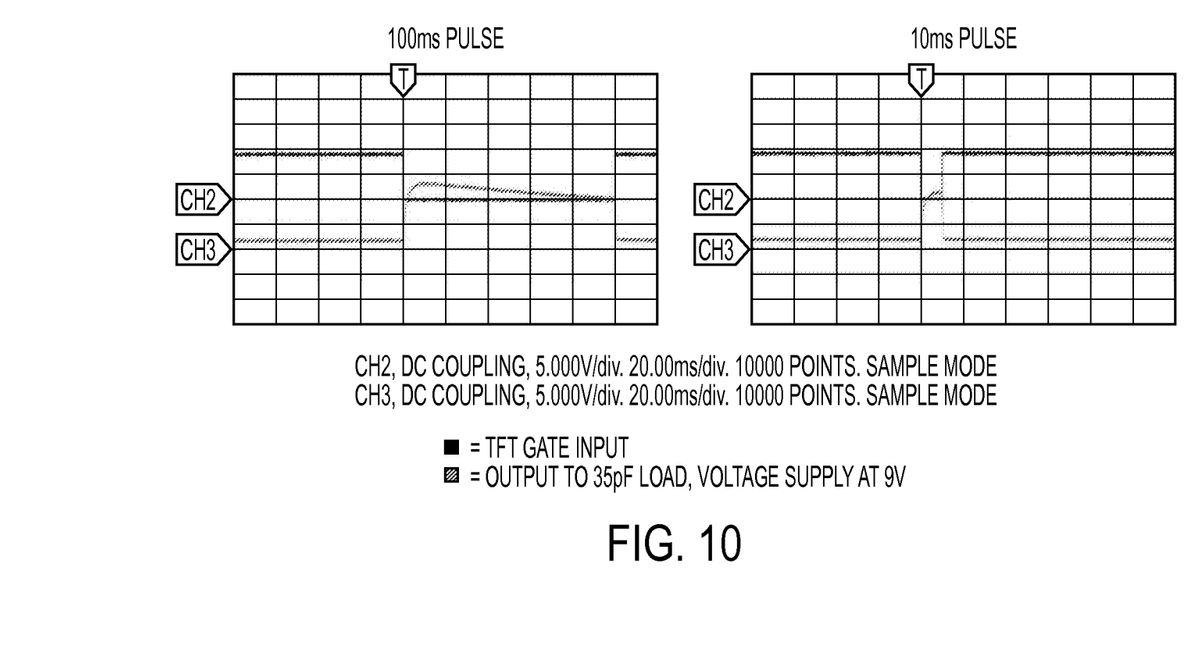
FIG. 10 shows pulse width timing diagrams.

FIG. 10 shows experimental results with the output voltage going to a 35 picoFarad load and a supply voltage at 9V. The two outputs show the gate input as the upper trace and the voltage multiplier output on the lower trace. When the gate input has a falling edge, the voltage output is boosted until the gate input has a rising edge. The left graph shows a 100 millisecond pulse and the right graph shows a 10 millisecond pulse. This ability to control the pulse width adds even finer control to the boosting of the voltage.

One application of such a voltage multiplier would be in the writing to ferroelectric memory cells. To avoid excessive voltage stress on the ferroelectric capacitors, the voltage multiplier output must be limited to a short pulse width. The quick and controlled discharge of the capacitors in the multiplier allows fine control of the pulse width, while still attaining the higher voltages needed.

Figure 11:
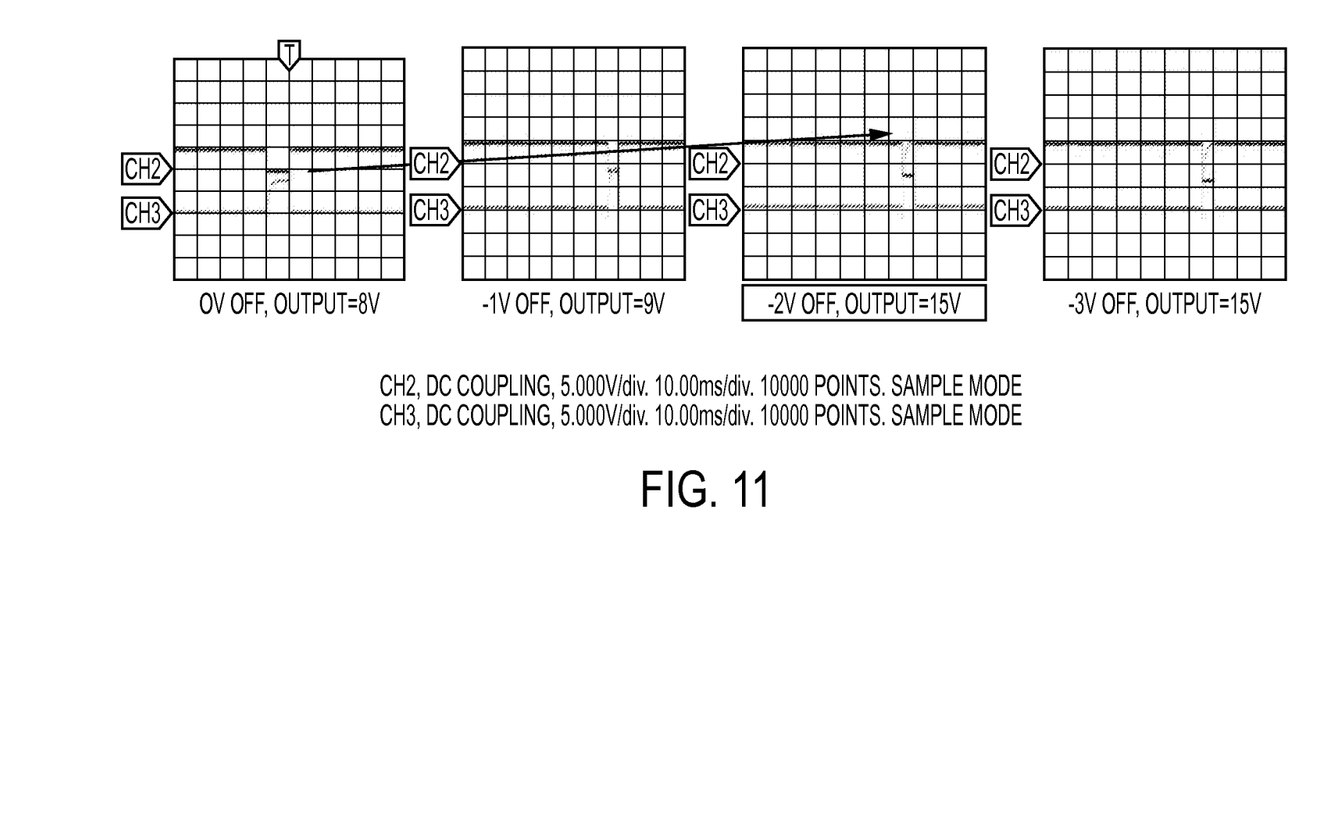
FIG. 11 shows output results from variations of gate voltage.

Another level of control exists at controlling the amplitude of the gate input signal, in part due to the limited ON/OFF ratio of printed TFTs when operated between 0V and the supply voltage. When the gate input signal has an ON voltage of 5V, one can control the voltage of the OFF signal to change the resulting output voltage. As shown in FIG. 11, when the input signal has a 0V OFF level, the output of the multiplier is 8V. When the input signal has a −1V OFF level, the output of the multiplier is 9V. Similarly, a −2V gate signal results in a 15V output, as does a −3V input signal. This provides control of the amplitude of the output in addition to the width of the pulse.

As discussed above, the architectures here are uniquely suited for printed electronics. To manufacture the pulsed voltage multipliers, a printing device is loaded with the desired solutions. A controller for the printer receives the necessary image data for the input stage, a pre-determined number of multiplier stages and the output stage. These stages are not discretely printed to completion in series. In order to avoid repeated changes of the solution, typically all components or parts of the components to be printed with one solution are printed, then the solution is changed, then the components to be printed with the next solution is printed, until all of the components and their connections are completed. In one embodiment, the architecture consists of organic Schottky diodes, polymer capacitors, carbon resistors and organic thin-film transistors.

In this manner, a pulsed voltage multiplier is provided that can be printed, has a repeatable multiplier stage, and has structures to adjust for the nature of printed components. In addition, the multiplier provides the ability to control both the pulse width and the amplitude of the output voltage.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A voltage multiplier, comprising:
   a supply voltage;
   an input stage;
   at least two multiplier stages electrically connected together, and a first of the at least two multiplier stages electrically connected to the input stage, each multiplier stage having a trigger voltage terminal, an input terminal, an output terminal, and a capacitor, and each multiplier stage connected to the supply voltage, wherein each stage comprises:
   a first diode electrically connected between the supply voltage and a first terminal of the capacitor;
   a second diode electrically connected between a second terminal of the capacitor and the input terminal of the stage; and
   a thin film transistor electrically connected to the second terminal of the capacitor by a drain of the transistor, the trigger voltage terminal electrically connected to a gate of the thin film transistor; and
   an output stage electrically connected to a final of the at least two multiplier stages.

2. The voltage multiplier of claim 1, wherein the multiplier stages comprise inkjet printed components.

3. The voltage multiplier of claim 1, wherein each stage comprises:
   a first thin film transistor electrically connected between the supply voltage and a first terminal of the capacitor;
   a diode electrically connected between a second terminal of the capacitor and an input terminal to the stage; and
   a second thin film transistor electrically connected to the second terminal of the capacitor.

4. The voltage multiplier of claim 1, wherein the input stage comprises:
   a diode electrically connected between the supply voltage and a first terminal of the capacitor;
   a second terminal of the capacitor electrically connected to ground; and
   an output terminal of the input stage electrically connected at a point between the diode and the first terminal of the capacitor.

5. The voltage multiplier of claim 1, wherein the output stage comprises:
   an output resistor connected between an output terminal of the final stage and an output terminal of the multiplier; and
   a transistor electrically connected to the resistor and the output terminal of the multiplier.

6. A method of manufacturing a voltage multiplier, comprising:
   loading an inkjet print head with solution;
   sending circuit schematics to drive electronics in communication with the print head;
   printing an input stage for a voltage multiplier on a substrate;
   printing a pre-determined number of multiplier stages on the substrate such that a first of the multiplier stages connect to the input stage and each multiplier stage connects to other multiplier stages; and
   printing an output stage such that a final multiplier stage connects to the output stage.

7. A method of operating a voltage multiplier, comprising:
   providing a supply voltage to a diode in a first multiplier stage, the diode electrically connected to the first terminal of a capacitor;
   charging the capacitor to the supply voltage;
   delivering a trigger signal to a transistor electrically connected to a second terminal of a capacitor, the trigger signal causing the transistor to turn off; and
   delivering a voltage output from the first terminal of the capacitor that is higher than the supply voltage.

8. The method of claim 7, further comprising delivering a second trigger signal to the transistor of an opposite polarity to the first trigger signal, causing the transistor to turn on and pull the voltage output to ground.

9. A voltage multiplier, comprising:
   a supply voltage;
   an input stage;
   at least two multiplier stages electrically connected together, and a first of the at least two multiplier stages electrically connected to the input stage, each multiplier stage having a trigger voltage terminal, an input terminal, an output terminal, and a capacitor, and each multiplier stage connected to the supply voltage, wherein each stage comprises:
   a first thin film transistor electrically connected between the supply voltage and a first terminal of a capacitor;
   a second thin film transistor electrically connected to a second terminal of the capacitor and the trigger voltage by a gate of the second transistor; and
   a resistor electrically coupled between the second terminal of the capacitor and the input terminal of the stage; and
   an output stage electrically connected to a final of the at least two multiplier stages.

10. The voltage multiplier of claim 9, wherein the input stage comprises:
    a diode electrically connected between the supply voltage and a first terminal of the capacitor;
    a second terminal of the capacitor electrically connected to ground; and
    an output terminal of the input stage electrically connected at a point between the diode and the first terminal of the capacitor.

11. The voltage multiplier of claim 9, wherein the output stage comprises:
    an output resistor connected between an output terminal of the final stage and an output terminal of the multiplier; and
    a transistor electrically connected to the resistor and the output terminal of the multiplier.

12. A voltage multiplier, comprising:
    a supply voltage;
    an input stage;
    at least two multiplier stages electrically connected together, and a first of the at least two multiplier stages electrically connect to the input stage, each multiplier stage having a trigger voltage terminal, an input terminal, an output terminal, and a capacitor, and each multiplier stage connected to the supply voltage, wherein each stage comprises:
    a first thin film transistor electrically connected between the supply voltage and a first terminal of the capacitor;
    a diode electrically connected between a second terminal of the capacitor and an input terminal to the stage; and a second thin film transistor electrically connected to the second terminal of the capacitor; and an output stage electrically connected to a final of the at least two multiplier stages.

13. The voltage multiplier of claim 12, wherein the input stage comprises:

a diode electrically connected between the supply voltage and a first terminal of the capacitor;

a second terminal of the capacitor electrically connected to ground; and an output terminal of the input stage electrically connected at a point between the diode and the first terminal of the capacitor.

14. The voltage multiplier of claim 12, wherein the output stage comprises:

an output resistor connected between an output terminal of the final stage and an output terminal of the multiplier; and a transistor electrically connected to the resistor and the output terminal of the multiplier.

* * * * *